United States Patent [19]
Okuhara

[11] 3,942,040
[45] Mar. 2, 1976

[54] SEMICONDUCTOR SPEECH PATH SWITCH CIRCUITRY
[75] Inventor: Shinzi Okuhara, Fujisawa, Japan
[73] Assignee: Hitachi, Ltd., Japan
[22] Filed: June 28, 1974
[21] Appl. No.: 484,320

[30] Foreign Application Priority Data
July 2, 1973 Japan.................................. 48-73729

[52] U.S. Cl.......................... 307/252 G; 179/18 GF
[51] Int. Cl.².......................................... H03K 17/56
[58] Field of Search .. 307/252 G; 179/1 SW, 18 GF

[56] References Cited
UNITED STATES PATENTS
3,531,773  9/1970  Beebe.......................... 179/18 GF X
3,688,051  8/1972  Aagaard.......................... 179/18 GF OTHER PUBLICATIONS
G.E. Transistor Manual General Electric Company Syracuse, New York, 1964, pp. 393, 394.

*Primary Examiner*—James B. Mullins
*Attorney, Agent, or Firm*—Craig & Antonelli

[57] ABSTRACT

A semiconductor speech path switch circuitry is disclosed in which a terminal is provided to one region of a semiconductor device located between two points to be channeled to each other and having a four-region structure of PNPN with three PN junctions, the one region having the lowest impurity concentration in the semiconductor device and also determining the breakdown voltage thereof, a bias voltage being applied to the terminal through a variable impedance circuit exhibiting a high impedance in the turned-on state of the semiconductor device while exhibiting a low impedance in the turned-off state of the semiconductor device. In the semiconductor channel switch circuitry, the crosstalk through the junction capacitances is greatly reduced and the available frequency band is wide.

14 Claims, 12 Drawing Figures

SEMICONDUCTOR SPEECH PATH SWITCH CIRCUITRY

The present invention relates to a semiconductor speech path switch circuitry for an exchanger or the like and more particularly to a semiconductor speech path switch circuitry whose transmission frequency band is widened.

There have been attempts to construct a speech path switch for an exchanger with semiconductor. Typically, PNPN diode or switch has been used. The PNPN diode or switch, once it is turned on, has an ability to keep itself turned on until an external power supply associated therewith is cut off. Therefore, it can be used as an element capable of keeping a closed condition during the conversation, in a channel switch for an automatic electrical exchanger etc. The PNPN diode or switch is well known by the term "thyristor" or "SCR". It structurely comprises four regions of PNPN having three PN junctions and electrically is regarded as a complimentary circuit comprising an NPN transistor and a PNP transistor in which the collector of the NPN transistor and the base of the PNP transistor are connected together and the base of the NPN transistor and the collector of the PNP transistor are connected together.

Such a useful element, however, has a disadvantage that, when it is used at a high frequency, the capacitive crosstalk occurs through the junction capacitance, thus resulting in a restriction in the widening of the frequency band.

Accordingly, an object of the present invention is to provide a speech path switch circuitry which uses a semiconductor device comprising a four-region structure of PNPN with three PN junctions and which is applicable over a wide frequency range.

Another object of the present invention is to provide a semiconductor speech path switch circuitry using a gate controlled PNPN switch with a high gate sensitivity.

According to one aspect of the present invention, there is provided a semiconductor speech path switch circuitry comprising a semiconductor device having a four-region structure of PNPN with three PN junctions, a terminal provided to one region of the four regions of said semiconductor device having the lowest impurity concentration among said four regions and determining the breakdown voltage of said semiconductor device, and a variable impedance circuit connected to said terminal and exhibiting a high impedance in the turned-on state of said semiconductor device and a low impedance in the turned-off state of said semiconductor device.

The above and other objects, features and advantages of the present invention will be apparent when reading the following description in conjunction with the accompanying drawings, in which.

The speech path using a conventional PNPN switch and the structure of the PNPN switch are first explained with reference to FIGS. 1 and 2, before explaining the embodiments of the present invention.

Figure 1:
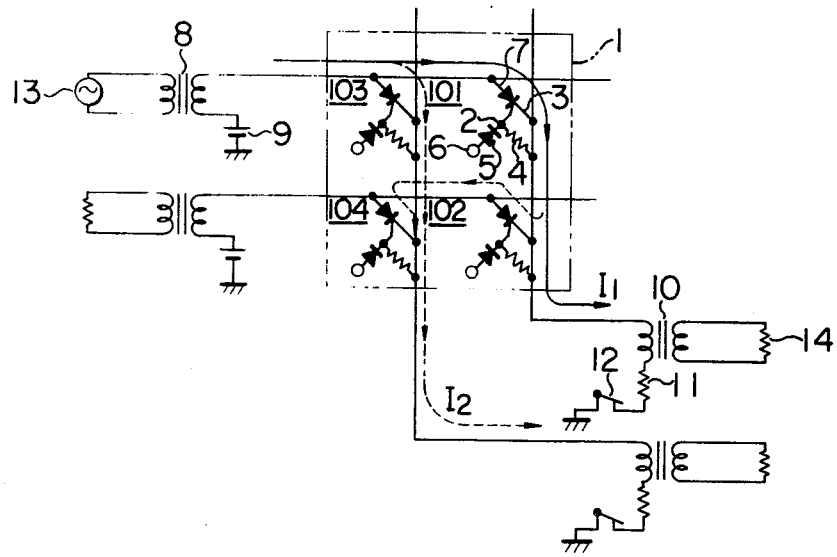
FIG. 1 is a circuit diagram of an example of the known speech path circuit construction.

FIG. 1 illustrates an example of the speech path circuit construction using the conventional PNPN switch, in which a speech path switch 1 is a matrix array consisting of a great number of the PNPN switches. Only four PNPN switches 101, 102, 103 and 104 are here employed only for illustration purpose. The PNPN switch 101 is provided with a resistor 4 connected between a gate 2 and a cathode 3 for preventing an erroneous operation due to the rate effect, and a control gate terminal 6 connected to the gate 2 through a diode 5 for preventing the reverse flow of current. An anode 7 is connected to a positive power source 9, while the cathode 3 is grounded through a transformer 10, a current setting resistor 11 and a switch 12. The transformer 10, the resistor 11, and the switch 12 may be fabricated into a set of electronic circuit assembly. When a pulse-shaped control signal is applied to the gate control terminal 6 in the thus constructed circuit, the PNPN switch 101 is fired to allow a d.c. current to flow therethrough until the switch 12 is turned off. A signal 13 applied to the transformer 8 is supperposed on the d.c. current flowing through the PNPN switch 101 and flows in the direction of arrow $I_1$ as drawn with a solid line, reaching a load 14. Here, the signal 13 corresponds to a talking telephone while the load 14 corresponds to a listening telephone. Although the above description has been made referring to the PNPN switch 101, the same description is also true for the PNPN switches 102, 103 and 104.

Assume now that when the PNPN switch 101 is in its turned-on state to permit a signal to be transmitted therethrough, another PNPN switch 104 is turned-on to form another speech path. In this case, information included in the signal 13 leaks to an unexpected speech path through the junction capacitors of the PNPN switch 102 and 103 in a turned-off state, as shown in an arrow $I_2$ of a dotted line. This phenomenum is called a crosstalk and provides a little problem in a low frequency region, but provides a serious problem in a high frequency region.

Figure 2A:
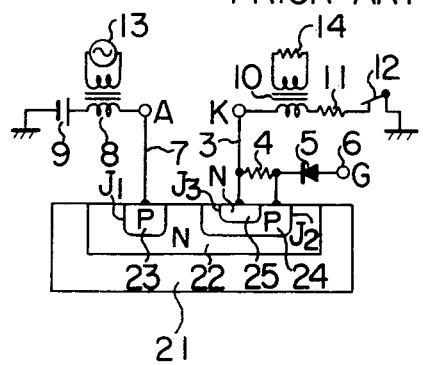
FIGS. 2a, 2b and 2c are sectional views of the major structure portion of the PNPN switch of the speech path circuit construction shown in FIG. 1 and a crosstalk equivalent circuit diagram.
Figure 2B:
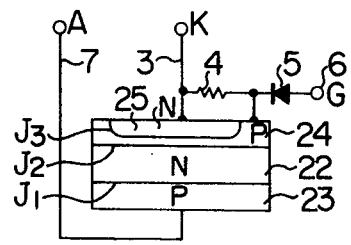
Figure 2C:
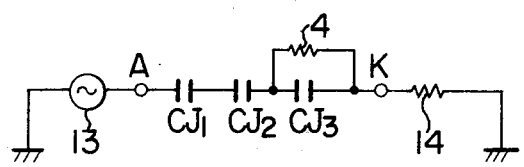

Reference is now made to FIGS. 2a–2c, showing sectional views of the structure of the main portion of a conventional PNPN switch, and an equivalent circuit diagram for the crosstalk when the switch is turned off. FIG. 2a shows a sectional view of the major portion of the PNPN switch and its associated circuit, when the switch is fabricated in the form of integrated circuits. The switch is comprised of a semiconductor body (wafer) 21, an N-type single crystal region 22 insulated and isolated in the semiconductor body, two P-type regions 23 and 24 diffused in the N-type single crystal region, and a N-type region 25 diffused in the P-type region 24. The regions 22, 23 and 24 constitute a lateral PNP transistor while the regions 22, 24 and 25 constitute a NPN transistor. These transistors are complimentarily connected to form a PNPN switch. The region 23 serves as an anode A, the region 25 as a cathode K and the region 24 as a gate whose terminal G is connected through a diode 5 with the region 24. The regions 24 and 25 is shorted by a resistor 4 for preventing an erroneous operation due to the rate effect. The resistor 4 and the diode 5 may also be integrally formed in the remaining part of the body 21. The transformer 8, 10 and other components described in FIG. 1 are connected as shown in the figure. FIG. 2b is a cross sectional view of an example of the PNPN switch of a vertical structure type which is generally manufactured as a discrete component and in which PNPN regions are piled in the vertical direction. In the figure, like reference numerals and symbols are used therein to denote like functioning regions and like portions appearing in FIG. 2a.

In FIGS. 2a and 2b diagrammatically illustrating the PNPN switch, the first region 23 as counted from the anode A and the second region 22 form a first PN junction $J_1$, the second and third regions 22 and 24 a second PN junction $J_2$, and the third and fourth regions 24 and 25 a third PN junction $J_3$. The turned-off state of the PNPN switch indicates that no d.c. current flows therethrough. An equivalent circuit between the anode and the cathode in such a state is shown in FIG. 2c. As is seen from the figure, the three junctions connected in series serve as electrostatic capacitors to permit the leakage of the signal 13 to the load 14. The third junction capacitance $C_{J3}$, however, is shorted by the resistor 4 and has a low impedance. As a result, it is the first and second junction capacitances $C_{J1}$ and $C_{J2}$ which determine the amount of the crosstalk. The junction capacitances $C_{J1}$ and $C_{J2}$ are substantially determined if the current capacity of the PNPN switch is determined, and therefore offer an obstacle in the application of the switch at a high frequency. For this reason, there has been an attempt in which the control gate terminal of the PNPN switch is grounded through a low impedance when it is turned off. When a gate circuit is provided with the diode 5, however, such an attempt is not useful for to the prevention of crosstalk because the diode 5 is in a cut-off state. Even if no diode is provided and when the resistor 4 is provided between the gate and the cathode for preventing an erroneous operation due to the rate effect, it may be considered that the resistor 4 gives a shunt to the load 14. Accordingly, in FIG. 1, the signal branches to the cathode-gate circuit, resulting in a signal loss.

The present invention is directed to eliminate such disadvantages and to obtain a speech path switch circuitry which uses a semiconductor device of four-region structure of PNPN with three PN junctions and is usable over a wide frequency range. The present invention also provides an improvement of the gate sensitivity in the case of the PNPN switch having a control gate. The semiconductor device of four-region structure of PNPN provided with the control gate will be hereinafter referred to as a PNPN switch, while that of no provision thereof is referred as a PNPN diode. Embodiments of the semiconductor speech path switch circuitry of the present invention will be given with reference to the accompanying drawings.

Figure 3A:
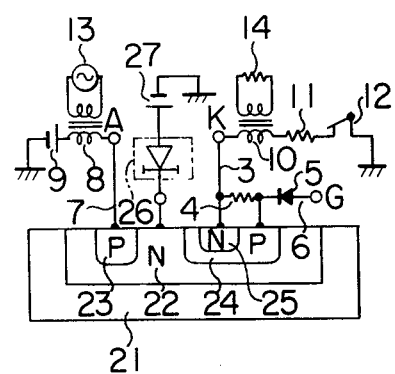
FIGS. 3a and 3b are a circuit diagram of a first embodiment of the semiconductor speech path switch circuitry according to the present invention and its crosstalk equivalent circuit diagram.
Figure 3B:
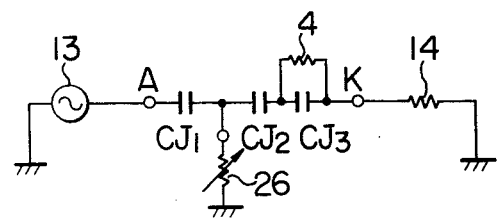
Figure 4A:
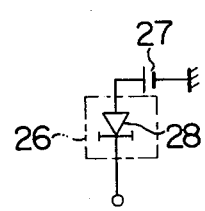
FIGS. 4a, 4b and 4c are circuit diagrams of various embodiments of a variable impedance circuit used in the present invention.
Figure 4B:
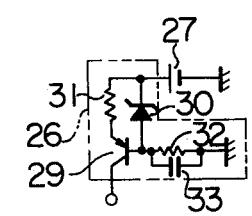
Figure 4C:
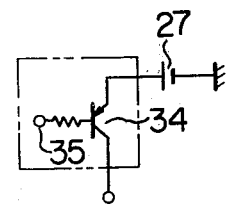

FIGS. 3a–3b illustrate an embodiment of the semiconductor speech path switch circuitry according to the present invention, and is illustrated in the manner similar to FIGS. 2a–2c. As will be seen from FIG. 3a, the semiconductor speech path switch circuitry according to the present invention is constructed such that a terminal is provided to the second region 22 and a bias voltage 27 is applied to the terminal through a variable impedance circuit 26 exhibiting a high impedance when the PNPN switch is turned on while exhibiting a low impedance when the switch is turned off. The variable impedance circuit 26 must have a low impedance enough to prevent the crosstalk when the PNPN switch is turned off. On the other hand, when the PNPN switch is turned on, the impedance circuit must have a high impedance enough to allow a little current to flow, in order that the signal does not branch to the circuit 26 and the selfholding ability of the PNPN switch is not deteriorated by the d.c. current flowing out of the bias voltage source 27. Some circuits as examples capable of fulfilling such a requirement are shown in FIGS. 4a–4c. FIG. 4a is an example employing a constant current diode 28 utilizing the junction field-effect. FIG. 4b is an example in which a constant current circuit is comprised of a PNP transistor 29, a Zener diode 30, and resistors 31 and 32, and further, if necessary, a bypass condenser 33 to obtain a low impedance. As will be seen from FIG. 3a, during the turned-off state of the PNPN switch, no d.c. current flows through the variable impedance circuit 26 because the second region 22 is of N-type. Under this state, the constant current circuit is still in a low impedance state so that when the PNPN switch turns on the constant current flows through the circuit 26 with the result that the circuit 26 automatically exhibits a high impedance. Accordingly, the desired function is attainable by merely controlling the PNPN switch. In FIG. 4c, a switching circuit is designed so as to be more positively operable. That is, the switching circuit operates to switch over a high impedance to a low impedance, and vice versa. The switching circuit in FIG. 4c comprising a transistor 34 is controlled at its base terminal 35. The switching circuit is opened when the PNPN switch is turned on and closed when the PNPN switch is turned off. It is possible to construct other forms of the variable impedance circuit 26 being operable along the object of the present invention, by using a field-effect transistor or the like.

In the first embodiment of the present invention, the second region 22 is grounded through the variable impedance circuit 26 so that the junction point of the two jundtion capacitances $C_{J1}$ and $C_{J2}$ mentioned above is grounded. For this, when the PNPN switch is in its turned-off state, the variable impedance circuit exhibits a low impedance so that most of the signal 13 leaking out of the first conjunction capacitance $C_{J1}$ branches to the variable impedance circuit 26. As a result, the signal 13 going to the load 14 is greatly reduced. This is a first advantage of the present invention.

The reason why the positive bias voltage 27 is applied to the second region 22 through the circuit 26 is now explained. If the region 22 is grounded through only the circuit 26, the voltage of the source 9 applied to the anode A biases forwardly the first junction with the result that the current flows in a reverse direction into the circuit 26. If the circuit 26 also exhibits a constant current characteristic for the reverse flow direction of current, the circuit 26 is changed by the current into a high impedance circuit, failing to attain the aimed effect. Furthermore, even in a PNPN switch desired to be turned off, since the current flows through the first junction, there is a great possibility that the current triggers the PNPN switch to be erroneously turned on. If the diode is used to prevent the reverse flow of the current, the use of the circuit 26 becomes meaningless, failing to prevent the crosstalk. As a consequence, the reverse current is blocked by using the bias voltage 27. The value of the bias voltage 27 is selected to be greater than or equal to that of the source 9. It should be appreciated that there is produced a second advantage when the bias voltage 27 is set to be greater than that of the source 9. That is, in this case, the first junction of the PNPN switch is subjected to a reverse bias voltage, and at the same time the second junction also is subjected to a larger reverse bias voltage. When a reverse bias voltage V is applied to a junction, the junction capacitance thereof decreases in inverse proportion to V½ or V⅓. Thus, the application of the bias voltage 27 results in the reduction of the crosstalk and further reduces the crosstalk in cooperation with the circuit 26.

The third advantage of the present invention resides in an improvement of the stability to an erroneous operation due to the rate effect. The rate effect is known as a phenomenum that when a step voltage, i.e. a voltage having a short rising time, is applied to the anode of the PNPN switch being in its turned-off state the switch often operates erroneously to be turned on. In the PNPN switch according to the present invention, however, the erroneous operation thereof occurs hardly because the voltage of the second region is kept higher than that of the anode. As a result, the resistance of the resistor 4 may be set to be large, thereby to improve the control sensitivity of the PNPN switch. Since this phenomenon is not directly related to the object of widening the frequency band, a description thereof has been omitted. However, it is to be noted that this phenomenon contributes to improve the control sensitivity. This is the third advantage of the present invention.

In the embodiment shown in FIGS. 3a–3b, the second region 22 serving as a substrate region for fabricating the PNPN switch has the lowest impurity concentration among the regions of the switch structure, and substantially determines the breakdown voltage of the switch. The first and second junctions are allowed to have satisfactorily high breakdown voltages with almost same level, thereby enabling the realization of the present invention. Assume that in the embodiment of FIGS. 3a–3b the resistor 4 is not employed. In this case, a similar effect may be obtained in the a.c. operation if the variable impedance circuit 26 is connected to the third region 24 with a bias voltage 27 whose polarity is reversed, but d.c. circuitry design will encounter a difficulty because in this embodiment of FIGS. 3a–3b the breakdown voltage of the third region is low, i.e. only a few volts. Although the application of the present invention to the PNPN switch of vertical structure as shown in FIG. 2a has not been described, it will be easily realized from the foregoing description that the present invention may be applicable to such a structure switch in a similar way.

Figure 5:
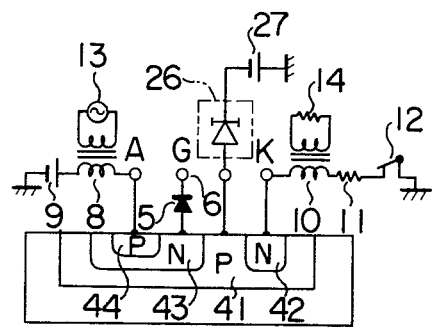
FIG. 5 is a circuit diagram of a second embodiment of the present invention.

A second embodiment of the present invention is shown in FIG. 5. In the case of the first embodiment shown in FIGS. 3a–3b, the PNPN switch is fabricated in the N-type semiconductor region as a substrate region. In this second embodiment, however, the PNPN switch is fabricated using the P-type semiconductor region 41 as a substrate, providing two N-type diffusion regions 42 and 43, and further providing a P-type diffusion region 44. That is, in FIG. 5, the conductivity types of the semiconductors in the respective regions are exchanged in comparison with FIGS. 3a–3b. The difference of FIG. 5 from FIGS. 3a–3b is that the polarity of the voltage and the direction of the current flow are reversed and the connection of the variable impedance circuit 26 is made to the third region in place of the second region. The function of the switch shown in FIG. 5 will be easily realized from the description about the FIGS. 3a–3b.

Figure 6:
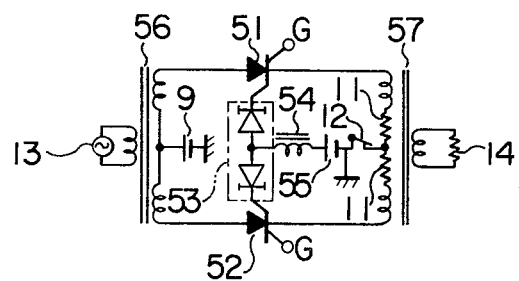
FIG. 6 is a circuit diagram of a third embodiment of the present invention.
Figure 7:
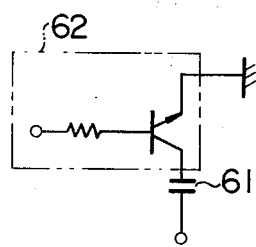
FIG. 7 is a circuit diagram of still another embodiment of the variable impedance circuit used in the present invention.

FIG. 6 illustrates a third embodiment of the present invention. The embodiments in FIGS. 3a–3b and 5 are the cases of the PNPN switches connected in the unbalanced transmission circuit. However, FIG. 6 shows a exemplary circuit diagram when the present invention is applied to the switch circuit incorporated into a balanced transmission circuit. In the preceding two embodiments the crosstalk circuit is grounded by the variable impedance circuit, while in this third embodiment two lines are short-circuited. In FIG. 6, a pair of the PNPN switches 51 and 52 are provided with a variable impedance circuit 53 so as to connect these switches to each other at their substrate regions, while a bias voltage 55 is applied through an inductance 54 to these switches. Transformers 56 and 57 are provided for the balanced transmission circuit. The power source 9 and others are the same as those employed in the previous embodiments and are denoted by the like reference representations used in the same embodiments. The function and effects of this embodiment will be easily understood from the description of the embodiment in FIGS. 3a–3b. Another variable impedance circuit shown in FIG. 7 may be employed in place of the combinations of the variable impedance circuit 26 or 53 and the bias voltage 27 or 55. The variable impedance circuit in FIG. 7 consists of a capacitor 61 whose capacitance is larger than that of the junction capacitor, and a switching circuit 62 connected to the capacitor in series, which is opened in the turned-on state of the PNPN switch while closed at the turn-off state thereof.

From the foregoing description, it will be understood that the present invention provides a useful technique for obtaining the switch operable over a wide frequency range, with a view to considerably improving the crosstalk problem in the turned-off switch circuit by incorporating the variable impedance circuit into the speech path switch using the PNPN switches, each of the switches being of four-region structure of PNPN. While the descriptions have been made for the case of the PNPN switch, it will be apparent that the present invention may be applicable to the PNPN diode having no control gate terminal and, in such a case, similar effects may be obtainable. Accordingly, it should be noted that the present invention may be applied to any semiconductor device, if it is of a four-region structure of PNPN with three PN junctions, irrespective of the existance of the control gate terminal.

What is claimed is:

1. A semiconductor speech path switch circuit comprising a semiconductor device having a four-region structure of PNPN with three PN junctions, terminals provided respectively to the four regions of said semiconductor device, an impedance element connected between the terminals provided to two of said four regions forming therebetween one of said three PN junctions which is not adjacent to a substrate of said four regions having the lowest impurity concentration among said four regions and determining the breakdown voltage of said semiconductor device, and a variable impedance circuit connected to the terminal provided to said substrate region and exhibiting a high impedance in the turned-on state of said semiconductor device and a low impedance in the turned-off state of said semiconductor device.

2. A semiconductor speech path switch circuit comprising a semiconductor device located between two points to be conductively coupled to each other and having a four-region structure of PNPN with three PN junctions, terminals provided respectively to the four regions of said semiconductor device, an impedance element connected between the terminals provided to two of said four regions forming therebetween one of said three PN junctions which is not adjacent to a substrate of said four regions having the lowest impurity concentration among said four regions and determining the breakdown voltage of the semiconductor device, and a variable impedance circuit exhibiting a high impedance in the turned-on state of said semiconductor device and a low impedance in the turned-off state of said semiconductor device, a bias voltage being applied through said variable impedance circuit to the terminal provided to said substrate region.

3. A semiconductor speech path switch circuit according to claim 2, in which said variable impedance circuit comprises a constant current diode.

4. A semiconductor speech path switch circuit according to claim 2, in which said variable impedance circuit comprises a constant current circuit.

5. A semiconductor speech path switch circuit according to claim 2, in which said variable impedance circuit comprises a switching circuit opened when said semiconductor device is turned on and closed when said semiconductor device is turned off.

6. A semiconductor speech path circuit circuit comprising a semiconductor device located between two points to be channeled and having a four-region structure of PNPN with three PN junctions, terminals provided respectively to the four regions of said semiconductor device, an impedance element connected between the terminals provided to two of said four regions forming therebetween one of said three PN junctions which is not adjacent to a substrate of said four regions having the lowest impurity concentration among said four regions and determining the breakdown voltage of said semiconductor device, a capacitive element having a larger capacitance than the junction capacitance of said semiconductor device, and a switching circuit opened when said semiconductor device is turned on and closed when said semiconductor device is turned off, the terminal provided to said substrate region being a.c. wise-grounded through said capacitive element by said switching circuit.

7. A semiconductor speech path switch circuit comprising a semiconductor device provided between speech path lines at each intersection of a plurality of speech path lines arranged in a matrix form and having a four-region structure of PNPN with three PN junctions, terminals provided respectively to the four regions of said semiconductor device, an impedance element connected between the terminals provided to two of said four regions forming therebetween one of said three PN junctions which is not adjacent to a substrate of said four regions having the lowest impurity concentration among said four regions and determining the breakdown voltage of said semiconductor device, and a variable impedance circuit connected to the terminal provided to said substrate region and exhibiting a high impedance in the turned-on state of said semiconductor device and a low impedance in the turned-off state of said semiconductor device, a bias voltage being applied through said variable impedance circuit to the terminal provided to said substrate region.

8. A semiconductor speech path switch circuit comprising a semiconductor device provided between speech path lines at each intersection of a plurality of speech path lines arranged in a matrix form and having a four-region structure of PNPN with three PN junctions, terminals provided respectively to the four regions of said semiconductor device, an impedance element connected between the terminals provided to two of said four regions forming therebetween one of said three PN junctions which is not adjacent to a substrate of said four regions having the lowest impurity concentration among said four regions and determining a breakdown voltage of said semiconductor device, a capacitive element having a larger capacitance than said junction capacitance of said semiconductor device, a switching circuit opened when said semiconductor device is turned on and closed when said semiconductor device is turned off, the terminal provided to said substrate region being connected through said capacitive element to said switching circuit so that the terminal provided to said substrate region is a.c. wise-grounded.

9. In a semiconductor communication path switch circuit comprising:
a semiconductor switching device having
a first semiconductor region of a first conductivity type,
a second semiconductor region of a second conductivity type, opposite said first conductivity type, contiguous with said first semiconductor region and defining a first PN junction therewith,
a third semiconductor region of said first conductivity type, contiguous with said second semiconductor region and defining a second PN junction therewith,
a fourth semiconductor region of said second conductivity type, contiguous with said third semiconductor region and defining a third PN junction therewith,
first, second, third and fourth terminals respectively connected to said first, second, third and fourth semiconductor regions, said first and fourth terminals being connected to respective communication path lines,
means, connected to said first and fourth terminals, for applying a forward bias voltage to said device, and
means, connected to said second terminal, for applying a gate voltage to said second region, so as to turn-on said device to provide a conductive path therethrough between said first and fourth terminals and, accordingly, between said respective communication path lines,
the improvement comprising:
a variable impedance circuit, connected between said third terminal and a source of reference potential, and providing a relatively high impedance between said third region and said source of reference potential during the turned-on state of said semiconductor device and for providing a relatively low impedance between said third region and said source of reference potential during the turned-off state of said semiconductor device.

10. The improvement according to claim 9, wherein said semiconductor switching device further includes an impedance element connected between said first and second terminals.

11. The improvement according to claim 10, in which said variable impedance circuit comprises a constant current diode.

12. The improvement according to claim 10, in which said variable impedance circuit comprises a constant current circuit.

13. The improvement according to claim 10, in which said variable impedance circuit comprises a switching circuit opened when said semiconductor device is turned on and closed when said semiconductor device is turned off.

14. The improvement according to claim 10, wherein the impurity concentration of said third semiconductor region is lower than the impurity concentration of said first, second and fourth semiconductor regions.

* * * * *